US008803725B2

(12) United States Patent
Osaki et al.

(10) Patent No.: US 8,803,725 B2
(45) Date of Patent: Aug. 12, 2014

(54) SINGLE SLOPE AD CONVERTER CIRCUIT PROVIDED WITH COMPARTOR FOR COMPARING RAMP VOLTAGE WITH ANALOG INPUT VOLTAGE

(71) Applicant: Semiconductor Technology Academic Research Center, Kanagawa (JP)

(72) Inventors: Yuji Osaki, Hyogo (JP); Tetsuya Hirose, Hyogo (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 13/862,723

(22) Filed: Apr. 15, 2013

(65) Prior Publication Data

US 2013/0271308 A1 Oct. 17, 2013

(30) Foreign Application Priority Data

Apr. 17, 2012 (JP) .................................. 2012-093682

(51) Int. Cl.
*H03M 1/34* (2006.01)
(52) U.S. Cl.
USPC ............ 341/164; 341/158; 341/169; 341/155; 341/170; 341/124; 327/218; 327/534; 327/538; 327/379; 324/76.11; 348/302; 348/294; 348/297
(58) Field of Classification Search
CPC ............ H03M 1/00; H03M 1/10; H03M 1/14; H03M 1/34; H03M 1/56; H03M 1/68; H03M 1/162; H03M 1/169; H03M 1/144; H03M 1/1215; H03M 1/1014; H03M 3/46; H03M 3/50; H03F 3/45188; H03K 3/023; H03K 3/012; H03K 3/0375; A61N 1/36032; A61N 1/37252; H04N 5/3745; H04N 5/3658; H02M 3/156; G05F 1/10

USPC ......... 341/118, 120, 124, 155, 158, 164, 169, 341/170; 324/76.11; 348/294, 297, 302; 327/218, 379, 534, 538, 157, 257
See application file for complete search history.

(56) References Cited

U.S. PATENT DOCUMENTS 4,191,942 A * 3/1980 Long .............................. 341/124
6,144,330 A * 11/2000 Hoffman et al. ............... 341/166
(Continued)

FOREIGN PATENT DOCUMENTS

| JP | 56-168429 | 12/1981 |
|----|-----------|---------|
| JP | 60-233937 | 11/1985 |

(Continued)

OTHER PUBLICATIONS

Shahrzad Naraghi et al., "A 9-bit, 14 μW and 0.06 mm² Pulse Position Modulation ADC in 90 nm Digital CMOS", IEEE Journal of Solid-State Circuits, vol. 45, No. 9, pp. 1870-1880, Sep. 2010.

(Continued)

*Primary Examiner* — Lam T Mai
(74) *Attorney, Agent, or Firm* — Wenderoth, Lind & Ponack, L.L.P.

(57) ABSTRACT

A single slope AD converter circuit includes a comparator that compares a ramp voltage varying with a predetermined slope as time elapses with an analog input voltage, a counter that counts a predetermined clock in parallel with the comparing process of the comparator, and a controller that outputs a clock count value corresponding to elapsed time when the ramp voltage is smaller than the analog input voltage, as an AD converted first digital value. The comparator compares the ramp voltage with a predetermined first reference voltage, the counter counts the clock in parallel with the comparing process, and the controller outputs the clock count value corresponding to the elapsed time as an AD converted second digital value.

13 Claims, 9 Drawing Sheets

(56) References Cited

U.S. PATENT DOCUMENTS

| | | | |
|---|---|---|---|
| 6,693,575 B1* | 2/2004 | Yang et al. | 341/155 |
| 7,554,478 B2* | 6/2009 | Lim | 341/169 |
| 7,907,079 B1* | 3/2011 | Galloway et al. | 341/169 |
| 7,924,207 B2* | 4/2011 | Snoeij et al. | 341/169 |
| 8,358,361 B2* | 1/2013 | Hasegawa | 348/300 |
| 8,390,486 B2* | 3/2013 | Wang et al. | 341/118 |
| 8,531,327 B2* | 9/2013 | Sohn | 341/170 |
| 8,552,901 B2* | 10/2013 | Danesh et al. | 341/169 |
| 8,614,639 B1* | 12/2013 | Yin et al. | 341/169 |
| 2008/0084936 A1 | 4/2008 | Yamashita et al. | |
| 2009/0009223 A1 | 1/2009 | Doi | |
| 2009/0253386 A1 | 10/2009 | Gagnon et al. | |

FOREIGN PATENT DOCUMENTS

| | | |
|---|---|---|
| JP | 2001-251189 | 9/2001 |
| JP | 2006-101119 | 4/2006 |
| JP | 2008-54256 | 3/2008 |
| JP | 2009-545195 | 12/2009 |
| JP | 2010-154562 | 7/2010 |
| WO | 2007088595 | 8/2007 |

OTHER PUBLICATIONS

Masaya Miyahara et al., "A Low-Noise Self-Calibrating Dynamic Comparator for High-Speed ADCs", IEEE Asian Solid-State Circuits Conference, pp. 269-272, Nov. 2008.

* cited by examiner

SINGLE SLOPE AD CONVERTER CIRCUIT PROVIDED WITH COMPARTOR FOR COMPARING RAMP VOLTAGE WITH ANALOG INPUT VOLTAGE

BACKGROUND OF THE INVENTION

1. Field of the Invention

The present invention relates to a single slope AD converter circuit (Single Slope Analog-To-Digital Converter Circuit, hereinafter referred to as an SSADC, and AD converter circuit is referred to as an ADC), and in particular, relates to a signal AD converter circuit provided with a comparator that compares a ramp voltage with an analog input voltage.

2. Description of the Related Art

In order to achieve ultralow power consumption of LSI (Large Scale Integration), a sub-threshold LSI that utilizes a sub-threshold region operation of MOSFET (Metal-Oxide Semiconductor Field-Effect Transistor, hereinafter referred to as a MOS transistor) attracts attention. However, since this designing method is in the initial stage of development, establishment of a designing technique of an ultralow power consumption circuit is strongly demanded. Up to now, various researches have been made to achieve an ultralow power LSI.

The AD converter circuit is a circuit block that converts an analog signal of a sensor signal, an audio signal or the like into a digital signal. The SSADC is also called PPM (Pulse Position Modulation) ADC (See, for example, the Non-Patent Document 1 and the Patent Documents 1 and 2), and used as a low-speed ADC.

Figure 1:
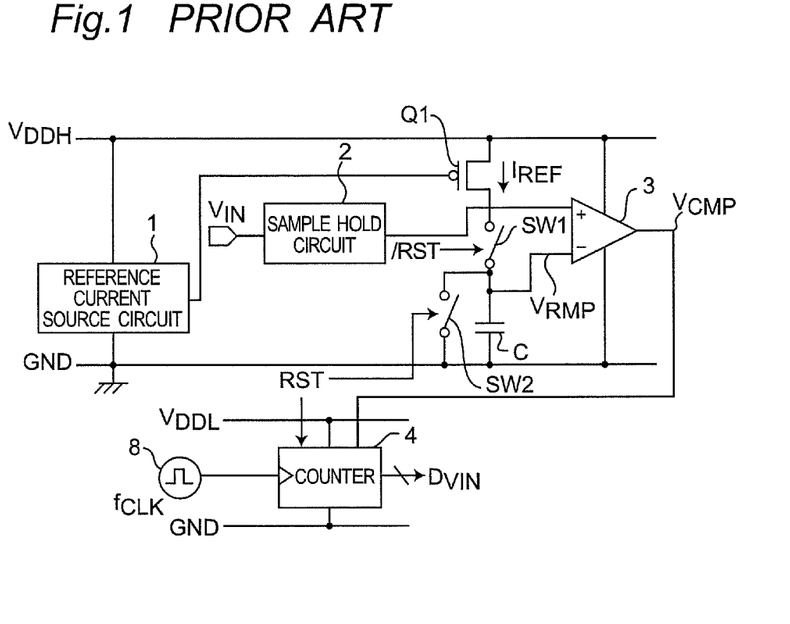
FIG. 1 is a circuit diagram showing a configuration of a prior art SSADC.

FIG. 1 is a circuit diagram showing a configuration of a prior art SSADC. Referring to FIG. 1, the prior art SSADC is configured to include a current source circuit 1, a sample hold circuit 2, a p-channel MOS transistor Q1, a capacitor C, a comparator 3, a switch SW1 that is turned on in response to an inverted reset signal /RST, a switch SW2 that is turned on in response to a reset signal RST, and a counter 4 that performs counting of a clock from a clock generator 8, and can be provided by a simple circuit block. In the present specification, the slash mark/before the signal symbol represents a low active signal. It is noted that $V_{DDH}$ is a power voltage of, for example, 1.8 V for an analog circuit, and $V_{DDL}$ is a power voltage of, for example, 0.4 V for use in a digital circuit. Moreover, there is sometimes a case where a reference current is externally supplied instead of the reference current source circuit 1 (See, for example, the Non-Patent Document 1).

Figure 2:
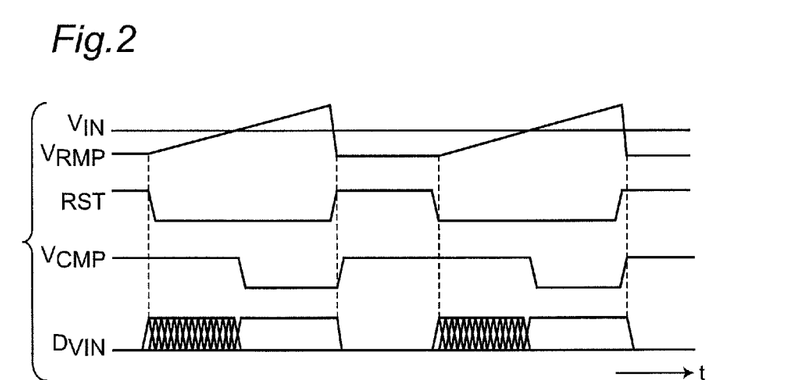
FIG. 2 is a timing chart of signals showing an operation of the SSADC of FIG. 1.

FIG. 2 is a timing chart of signals showing an operation of the SSADC of FIG. 1. Referring to FIG. 2, by turning on and off the switch SW2 in synchronization with the fall of the reset signal RST and thereafter turning on the switch SW 1 to supply a constant reference current $I_{REF}$ to the capacitor C, a ramp voltage $V_{RMP}$, whose voltage rises with a predetermined slope as the time elapses, is generated. Then, the comparator 3 compares a voltage obtained by sampling and holding an analog input voltage (hereinafter, referred to as an input voltage) $V_{IN}$ by the sample hold circuit 2 with the generated ramp voltage $V_{RMP}$. In this case, by measuring time to when the ramp voltage $V_{RMP}$ and the input voltage $V_{IN}$ become equal to each other by clock counting by the counter 4, the input voltage $V_{IN}$ is converted into a digital value $D_{VIN}$. The outputted digital value $D_{VIN}$ is expressed by the following equation:

$$D_{VIN} = \frac{CV_{IN}}{I_{REF}} f_{CLK}. \quad (1)$$

In this case, $f_{CLK}$ is a frequency of the clock. It can be understood from the Equation (1) that the digital value $D_{VIN}$ is outputted in accordance with the input voltage $V_{IN}$.

The digital value shown in the Equation (1) is satisfied only in an ideal case. In practice, the value receives influences from non-ideal factors of the delay time of the comparator 3 and PVT variations (indicating variations in manufacturing process, voltage and temperature) and so on. When these non-ideal factors exist, the digital value $D_{VIN}$ is expressed by the following equation:

$$D_{VIN} = \left( \frac{(C + \Delta C)(V_{IN} + V_{OFF})}{I_{REF} + \Delta I_{REF}} + \tau_{CMP} \right) (f_{CLK} + \Delta f_{CLK}). \quad (2)$$

In this case, $\Delta C$ is the variation of the capacitor C, $V_{OFF}$ is the offset voltage of the comparator 3, $\Delta I_{REF}$ is the variation of a reference current $I_{REF}$, $\tau_{CMP}$ is the delay time of the comparator 3, and $\Delta f_{CLK}$ is the variation of the clock frequency $f_{CLK}$.

Prior Art Documents related to the present invention are as follows:

Patent Documents

Patent Document 1: Japanese patent laid-open publication No. JP 2008-054256 A; and
Patent Document 2: Japanese patent laid-open publication No. JP 2010-154562 A.

Non-Patent Documents

Non-Patent Document 1: S. Naraghi et al., "A 9-bit 14 µW and 0.06 mm² pulse position modulation ADC in 90 nm digital CMOS," IEEE Journal Solid-State Circuits, pp. 1870-1880, September 2010; and
Non-Patent Document 2: M. Miyahara et al., "A low-noise self-calibrating dynamic comparator for high-speed ADCs," IEEE Asian Solid-State Circuits Conference, pp. 269-272, November 2008.

As apparent from the Equations (1) and (2), it can be understood that the digital value $D_{VIN}$ varies depending on the non-ideal factors. That is, the AD conversion characteristic of the SSADC deteriorates due to the PVT variations and so on.

The Non-Patent Document 1 proposes a circuit that improves a resolution of the SSADC by using a delay device. However, since the SSADC does not consider the influences due to the PVT variations, the conversion accuracy of the SSADC deteriorates due to the PVT variations. Moreover, in order to remove the influence of the delay time of the comparator, the delay time of the comparator needs to be shorter than the clock cycle. However, since the delay time of the comparator depends on the power consumption of the comparator, use of a high-speed comparator leads to an increase in the power consumption. Therefore, the influence of the delay time of the comparator that operates at low speed needs to be considered in the SSADC that operates with low power consumption.

Moreover, the Non-Patent Document 2 proposes a circuit that corrects the offset voltage of the comparator. However, since this circuit is provided for correcting only the offset voltage of the comparator, the characteristic deterioration due to the delay time of the comparator and other non-ideal factors cannot be corrected.

SUMMARY OF THE INVENTION

An object of the present invention is to solve the aforementioned problems and provide an SSADC capable of outputting an accurate digital value by correcting the characteristic deterioration due to the delay time of the comparator and other non-ideal factors.

According to one aspect of the present invention, there is provided a single slope AD converter circuit including a comparator, a counter and a controller. The comparator is configured to compare a ramp voltage varying with a predetermined slope as the time elapses with an analog input voltage, and the counter is configured to count a predetermined clock in parallel with the comparing process of the comparator. The controller is configured to output a clock count value corresponding to elapsed time when the ramp voltage is smaller than the analog input voltage, as an AD converted first digital value.

(A) The comparator compares the ramp voltage with a predetermined first reference voltage, the counter counts the clock in parallel with the comparing process, and the controller outputs the clock count value corresponding to the elapsed time as an AD converted second digital value.

(B) The comparator compares the ramp voltage with a predetermined second reference voltage different from the first reference voltage, the counter counts the clock in parallel with the comparing process, and the controller outputs the clock count value corresponding to the elapsed time as an AD converted third digital value.

(C) The controller divides one of a difference between the first and second digital values, and a difference between the first and third digital values, by a difference between the second digital value and the third digital value, and outputs a value of a division result as a value corresponding to an AD converted value.

In the above-mentioned AD converter circuit, when the first digital value is $D_{VDIN}$, the second digital value is $D_{VREF1}$, and the third digital value is $D_{VREF2}$, then the controller calculates a division result Q by using the following equation:

$$Q = \frac{D_{VIN} - D_{VREF1}}{D_{VREF2} - D_{VREF1}}.$$

In addition, in the above-mentioned AD converter circuit, when the first digital value is $D_{VDIN}$, the second digital value is $D_{VREF1}$, and the third digital value is $D_{VREF2}$, then the controller calculates a division result Q by using the following equation:

$$Q = \frac{D_{VIN} - D_{VREF2}}{D_{VREF2} - D_{VREF1}}.$$

Further, in the above-mentioned AD converter circuit, when the first digital value is $D_{VDIN}$, the second digital value is $D_{VREF1}$, and the third digital value is $D_{VREF2}$, then the controller calculates a division result Q by using the following equation:

$$Q = \frac{D_{VIN} - D_{VREF1}}{D_{VREF1} - D_{VREF2}}.$$

In the above-mentioned AD converter circuit, when the first digital value is $D_{VDIN}$, the second digital value is $D_{VREF1}$, and the third digital value is $D_{VREF2}$, then the controller calculates a division result Q by using the following equation:

$$Q = \frac{D_{VIN} - D_{VREF2}}{D_{VREF1} - D_{VREF2}}.$$

The above-mentioned AD converter circuit further includes a ramp voltage generator configured to generate the ramp voltage by electrically charging and/or discharging the capacitor with a predetermined reference current.

In addition, in the above-mentioned AD converter circuit, the controller calculates an AD converted value proportional to the analog input voltage by adding and/or subtracting a predetermined constant value that does not depend on the first digital value to and/or from the value of the division result, and outputs the calculated AD converted value.

Further, in the above-mentioned AD converter circuit, the controller performs feedback control of the AD converter circuit so that a difference between the second and third digital values becomes a predetermined default value, thereafter calculates one of a difference between the first and second digital values, and a difference between the first and third digital values, and outputs a calculated difference as a value corresponding to the AD converted value.

In this case, the controller performs feedback control of the AD converter circuit so that the difference between the second and third digital values becomes a predetermined default value by varying a clock frequency inputted to the counter.

In this case, the above-mentioned AD converter circuit further includes a voltage controlled oscillator, and a voltage generator circuit. The voltage controlled oscillator is configured to generate the clock so that the clock frequency varies on the basis of a predetermined control voltage. The voltage generator circuit includes a first circuit configured to increase a voltage of a further capacitor on the basis of an up-signal, and includes a second circuit configured to decrease the voltage of the further capacitor on the basis of a down-signal, and the voltage generator circuit outputs a voltage of the further capacitor as the control voltage. The controller increases the clock frequency with the voltage of the further capacitor increased by outputting the up-signal to the voltage generator circuit when increasing the clock frequency in performing control so that the difference between the second and third digital values becomes a predetermined default value, and/or decreases the clock frequency with the voltage of the further capacitor decreased by outputting the down-signal to the voltage generator circuit when decreasing the clock frequency in performing control so that the difference between the second and third digital values becomes a predetermined default value.

In this case, the controller performs feedback control of the AD converter circuit so that the difference between the second and third digital values becomes a predetermined default value by varying the capacitance of the capacitor.

In this case, the controller calculates an AD converted value proportional to the analog input voltage by adding and/or subtracting a predetermined constant value that does not depend on the first digital value to and/or from a calculated difference, which is one of a difference between the first and second digital values, and a difference between the first and third digital values, and outputs the calculated AD converted value.

Therefore, according to the AD converter circuit of the present invention, in the single slope AD converter circuit that includes the comparator, the counter, and the controller.

(A) The comparator compares the ramp voltage with a predetermined first reference voltage, the counter counts the clock in parallel with the comparing process, and the controller outputs the clock count value corresponding to the elapsed time as an AD converted second digital value.

(B) The comparator compares the ramp voltage with a predetermined second reference voltage different from the first reference voltage, the counter counts the clock in parallel with the comparing process, and the controller outputs the clock count value corresponding to the elapsed time as an AD converted third digital value.

(C) The controller divides one of a difference between the first and second digital values, and a difference between the first and third digital values, by a difference between the second and third digital values, and outputs a value of a division result as a value corresponding to an AD converted value.

By this operation, an accurate digital value can be outputted by correcting the characteristic deterioration due to the delay time of the comparator and other non-ideal factors.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments of the present invention will be described below with reference to the drawings. In the following preferred embodiments, like components are denoted by like reference numerals.

In the preferred embodiments of the present invention, an SSADC that removes influences due to the delay time of a comparator 3 and PVT variations is proposed by using two reference voltages $V_{REF1}$ and $V_{REF2}$. The proposed SSADC is characterized by correcting the influences of the PVT variations and the delay time of the comparator 3 by forming a feedback loop instead of subtraction and division or division with respect to the conversion time corresponding to each voltage.

First Preferred Embodiment

Figure 3:
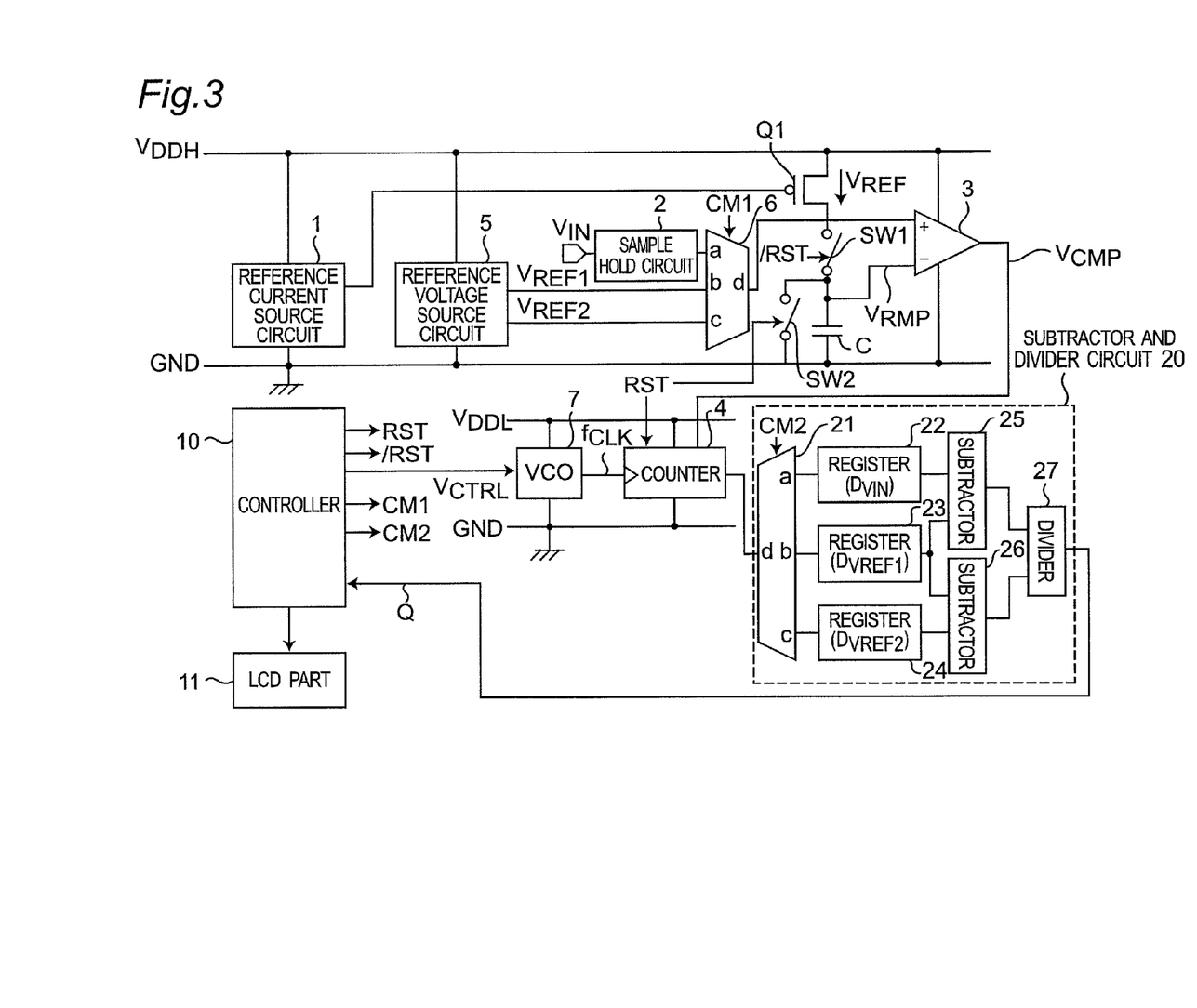
FIG. 3 is a circuit diagram showing a configuration of an SSADC according to a first preferred embodiment of the present invention.

FIG. 3 is a circuit diagram showing a configuration of an SSADC according to the first preferred embodiment of the present invention. By comparison to the prior art SSADC of FIG. 1, the SSADC of FIG. 3 is configured by further including:

(1) a controller 10 that is configured to include a digital computer such as a CPU or a DSP, and controls the operation of the SSADC;

(2) an LCD part 11 that displays results calculated by the controller 10 and the like;

(3) a reference voltage source circuit 5 that generates two reference voltages $V_{REF1}$ and $V_{REF2}$;

(4) a voltage switcher 6 that selects one voltage from among inputted three Voltages $V_{IN}$, $V_{REF1}$ and $V_{REF2}$ on the basis of a control signal CM 1 from the controller 10, and outputs the selected voltage to the comparator 3;

(5) a voltage controlled oscillator (VCO) 7 that generates clock pulses having a corresponding predetermined clock frequency $f_{CLK}$ on the basis of a control voltage $V_{CTRL}$ from the controller 10 corresponding to the voltage, and outputs the pulses to the counter 4; and (6) a subtractor and divider circuit 20 that calculates a division result Q by performing subtraction and division on the basis of three digital values $D_{VIN}$, $D_{VREF1}$ and $D_{VREF2}$ outputted from the counter 4, and outputs the result to the controller 10.

It is noted that $V_{DDH}$ is a power voltage of, for example, 1.8 V for an analog circuit, and $V_{DDL}$ is a power voltage of, for example, 0.4 V for a digital circuit.

In this case, the subtractor and divider circuit 20 is configured to include the following:

(a) a data switcher 21 that outputs the digital value from the counter 4 selectively to three registers 22, 23 and 24 according to predetermined three time measuring intervals on the basis of a control signal CM2 from the controller 10;

(b) a register 22 that temporarily stores the digital value $D_{VIN}$ corresponding to the input voltage $V_{IN}$;

(c) a register 23 that temporarily stores a digital value $D_{VREF1}$ corresponding to the first reference voltage $V_{REF1}$;

(d) a register 24 that temporarily stores a digital value $D_{VREF2}$ corresponding to the second reference voltage $V_{REF2}$;

(e) a subtractor 25 that performs subtraction of ($D_{VIN}$−$D_{VREF1}$) on the basis of the digital values from the registers 22 and 23, and outputs the digital value of the subtraction result to the divider 27;

(f) a subtractor 26 that performs subtraction of ($D_{VREF2}-D_{VREF1}$) on the basis of the digital values from the registers 23 and 24, and outputs the digital value of the subtraction result to the divider 27; and (g) a divider 27 that performs division of the Equation (3) on the basis of the digital values from the subtractors 25 and 26, and outputs the division result Q to the controller 10.

The SSADC of FIG. 3 is characterized in that it needs no externally reference clock since the SSADC generates the clock inside the circuit.

Referring to FIG. 3, a predetermined bias voltage from the reference current source 1 is applied to the gate of the MOS transistor Q1, and the MOS transistor Q1 flows a predetermined reference current $I_{REF}$ into the capacitor C via the switch SW1. The reference voltage generator circuit 5 generates mutually different predetermined two reference voltages $V_{REF1}$ and $V_{REF2}$, and the voltages are inputted to the non-inverted input terminal of the comparator 3 via the voltage switcher 6. The input voltage $V_{IN}$ to be subjected to AD conversion is sampled and held by the sample hold circuit 2, and thereafter, it is inputted to the non-inverted input terminal of the comparator 3 via the voltage switcher 6. The switch SW1 is turned on in response to the inverted reset signal /RST, and the switch SW2 is turned on in response to the reset signal RST. The charge of the capacitor C is discharged by turning on the switch SW2, and thereafter, the capacitor is charged with the reference current $I_{REF}$ by turning off the switch SW2 and turning on the switch SW1. This leads to that a ramp voltage $V_{RMP}$ that rises with a predetermined slope as the time elapses for comparing with each voltage is generated. Then ramp voltage generating means is configured to include the above arrangement.

Figure 4:
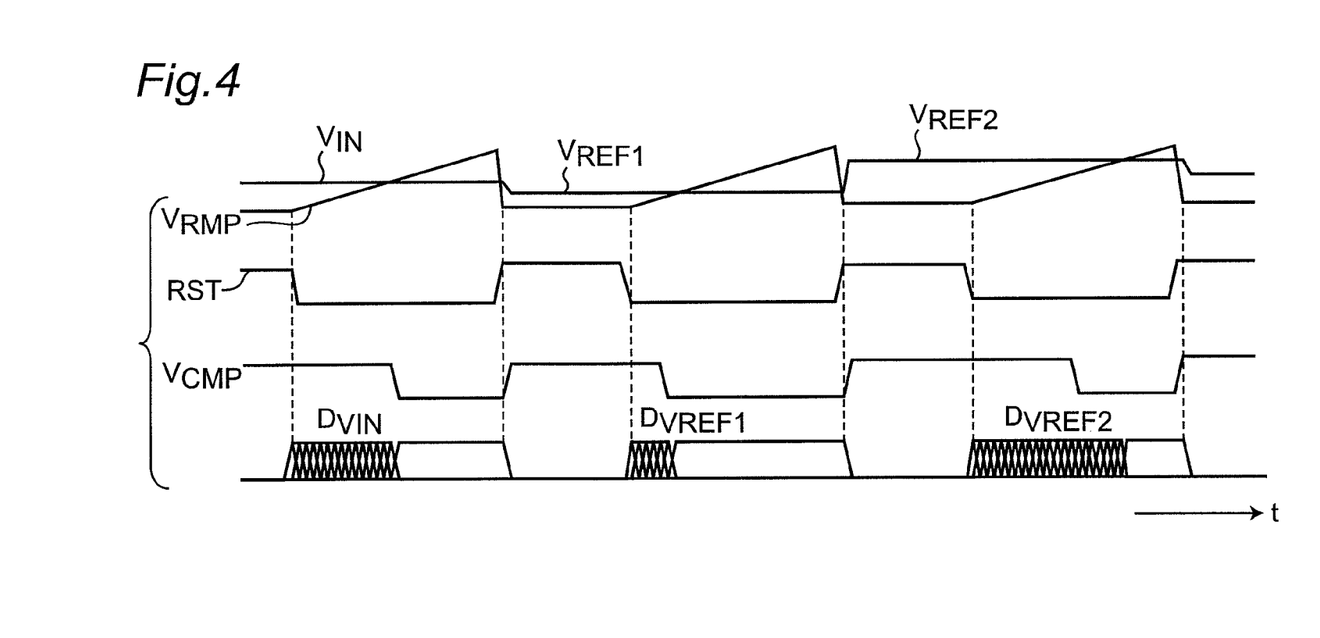
FIG. 4 is a timing chart of signals showing an operation of the SSADC of FIG. 3.

FIG. 4 is a timing chart of signals showing an operation of the SSADC of FIG. 3. The SSADC of the present preferred embodiment forms an output to the non-inverted input terminal of the comparator 3 by selective switchover of the voltage switcher 6 sequentially in an order of input terminals "a", "b" and "c" by three voltages (the input voltage $V_{IN}$, and the reference voltages $V_{REF1}$ and $V_{REF2}$), and the output is compared with the ramp voltage $V_{RMP}$ inputted to the inversed input terminal by the comparator 3. The time interval from the time when the charging of the capacitor C starts to the time when each voltage becomes equal to the ramp voltage $V_{RMP}$ (time interval during which the output voltage $V_{CMP}$ from the comparator 3 has a high level from the start of charging of the capacitor C) is counted by using the counter 4 for clock counting. By this operation, the digital value $D_{VIN}$ corresponding to the input voltage $V_{IN}$, the digital value $D_{VREF1}$ corresponding to the first reference voltage $V_{REF1}$, and the digital value $D_{VREF2}$ corresponding to the second reference voltage $V_{REF2}$ are obtained, and the values are stored into the registers 22, 23 and 24 via the data switcher 21 that selects the data of the digital value from the counter 4 selectively on the basis of a control signal CM2 from the controller 10, and outputs the data. Then, the following calculation is performed on the basis of the three digital values $D_{VIN}$, $D_{VREF1}$ and $D_{VREF2}$ by using the subtractors 25 and 26 and the divider 27, and the division result Q that is the AD converted value of the input voltage $V_{IN}$ is obtained. It is noted that the reference voltages $V_{REF1}$ and $V_{REF2}$ are predetermined values determined preparatorily.

$$Q = \frac{D_{VIN} - D_{VREF1}}{D_{VREF2} - D_{VREF1}}. \quad (3)$$

Considering herein a case where the PVT variations exert influences, the Equation (3) is expressed by the following equation:

$$Q = \frac{D_{VIN} - D_{VREF1}}{D_{VREF2} - D_{VREF1}} = \quad (4)$$

$$\frac{\left(\frac{(C+\Delta C)(V_{IN} + V_{OFF})}{I_{REF} + \Delta I_{REF}} + \tau_{CMP}\right)(f_{CLK} + \Delta f_{CLK}) - \left(\frac{(C+\Delta C)(V_{REF1} + V_{OFF})}{I_{REF} + \Delta I_{REF}} + \tau_{CMP}\right)(f_{CLK} + \Delta f_{CLK})}{\left(\frac{(C+\Delta C)(V_{REF2} + V_{OFF})}{I_{REF} + \Delta I_{REF}} + \tau_{CMP}\right)(f_{CLK} + \Delta f_{CLK}) - \left(\frac{(C+\Delta C)(V_{REF1} + V_{OFF})}{I_{REF} + \Delta I_{REF}} + \tau_{CMP}\right)(f_{CLK} + \Delta f_{CLK})} = \frac{V_{IN} - V_{REF1}}{V_{REF2} - V_{REF1}}.$$

As apparent from the Equation (4), the division result Q that corresponds to the input voltage $V_{IN}$ and is a linear function of the input voltage $V_{IN}$ becomes a value, which is determined by only the input voltage $V_{IN}$ and the reference voltages $V_{REF1}$ and $V_{REF2}$, and from which the influences of the non-ideal factors of the delay time of the comparator 3, then the PVT variations and so on are removed. In general, since the reference voltages $V_{REF1}$ and $V_{REF2}$ are stable with respect to the PVT variations in comparison with the reference current, the division result Q does not depend on the PVT variations, and a constant output can be obtained. Since the division result Q is the linear function value of the input voltage $V_{IN}$, the proportional value (AD converted value) of the input voltage $V_{IN}$ can be obtained by adding a predetermined constant value (second term ($V_{REF1}$)/($V_{REF2}-V_{REF1}$) of the Equation (4)) that does not depend on the digital value $D_{VIN}$ or subtracting $-(V_{REF1})/(V_{REF2}-V_{REF1})$ to or from the division result Q. The obtained division result and the AD converted value are displayed on the LCD part 11.

In the present preferred embodiment, as apparent from FIG. 4, the input voltage $V_{IN}$ to be AD converted, the first reference voltage $V_{REF1}$ and the second reference voltage $V_{REF2}$ are required to be predetermined values, respectively, within a range between the lower limit value and the upper limit value of the ramp voltage $V_{RMP}$.

Moreover, in the SSADC of FIG. 3, an up-down counter may be constructed to be used in place of the subtractors 25 and 26. In this case, a digital value before the subtraction can be obtained by performing countdown so as to subtract only the digital value $D_{VREF1}$ corresponding to the reference voltage $V_{REF1}$ from the digital value $D_{VIN}$ of the input voltage $V_{IN}$ and performing countdown so as to subtract the digital value $D_{VREF2}$ corresponding to the reference voltage $V_{REF2}$ from the digital value $D_{VIN}$ of the input voltage $V_{IN}$.

Although the subtractor and divider circuit 20 is configured to include the hardware circuit in the preferred embodiment described above, the present invention is not limited to this but allowed to be constructed so as to operate the subtractor and divider circuit 20 by the controller 10.

Second Preferred Embodiment

Figure 5:
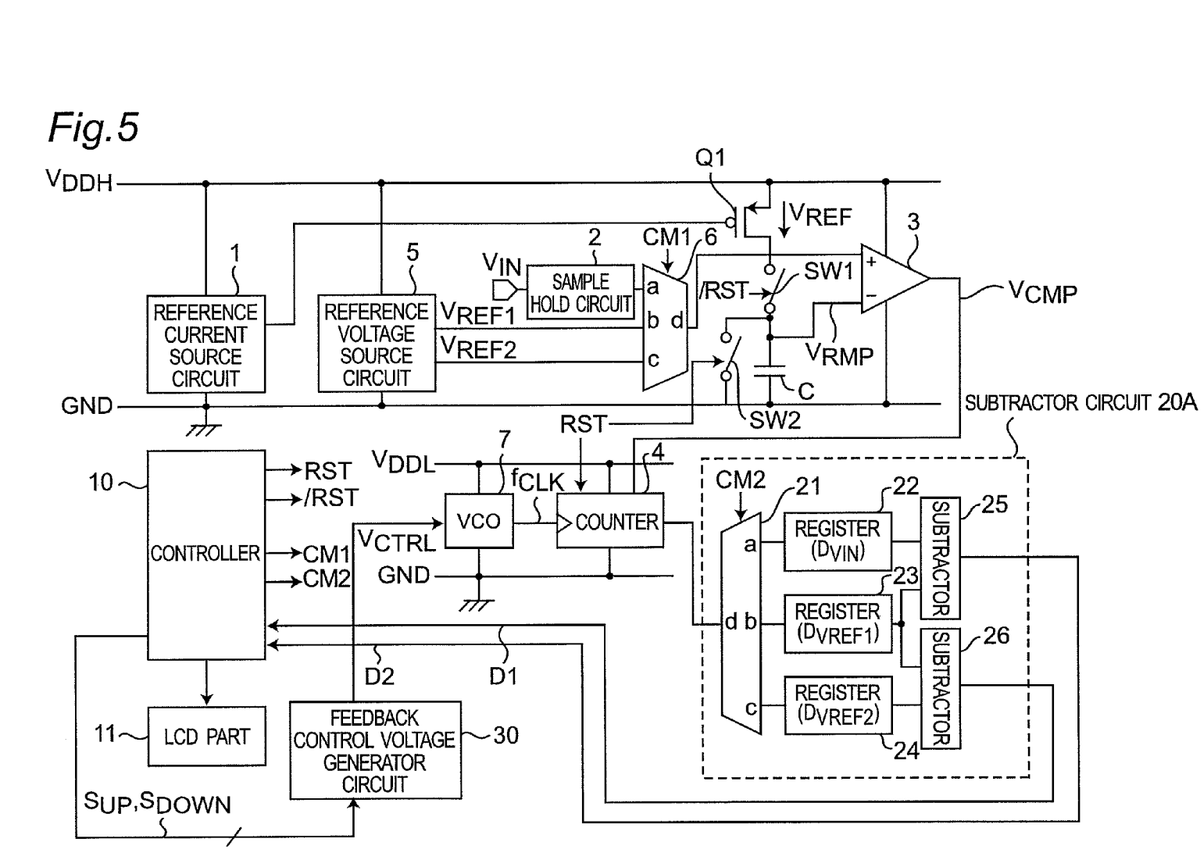
FIG. 5 is a circuit diagram showing a configuration of an SSADC according to a second preferred embodiment of the present invention.

FIG. 5 is a circuit diagram showing a configuration of an SSADC according to the second preferred embodiment of the present invention. By comparison to the SSADC of the first preferred embodiment of FIG. 3, the SSADC of the second preferred embodiment of FIG. 5 is characterized in that:

(1) a subtractor circuit 20A is provided in place of the subtractor and divider circuit 20; and (2) a feedback control voltage generator circuit 30 is further provided.

Referring to FIG. 5, the subtractor circuit 20A is configured by removing only the divider 27 from the subtractor and divider circuit 20. Moreover, in the feedback control voltage generator circuit 25, the feedback control voltage $V_{CTRL}$ thereof is controlled to heighten or lower the clock frequency $f_{CLK}$ of the voltage controlled oscillator 7 on the basis of an up-signal $S_{UP}$ and a down-signal $S_{DOWN}$ from the controller 10 as described in detail later with reference to FIG. 6.

As is indicated in the Equation (4), the influences due to the delay time of the comparator 3 and the PVT variations can be removed by the subtraction and the division. In this case, if the right member of the Equation (3) is assumed to be D2/D1, and a case where the denominator $D1=(D_{VREF2}-D_{VREF1})$ of the right member is constant is assumed, there is no need to perform the division.

A feedback loop circuit is used to achieve this. Assuming that the denominator D1 is a preset value, or the value of the denominator D1 is, for example, 512 (hereinafter, referred to as a default value), then the feedback loop circuit performs control so that the denominator D1 becomes 512. By this operation, the division result Q corresponding to the AD converted value can be obtained without using the divider circuit. The factor that can be controlled by the feedback loop circuit is the clock frequency $f_{CLK}$ of the voltage controlled oscillator 7 of FIG. 5, and the clock frequency $f_{CLK}$ is controlled by the feedback control voltage $V_{CTRL}$ generated by the feedback control signal generator circuit 30 controlled by the up-signal $S_{UP}$ and the down-signal $S_{DOWN}$ from the controller 10. Although the clock frequency $f_{CLK}$ of the voltage controlled oscillator 7 is controlled in order to set the denominator D1 to the default value in the present preferred embodiment, the present invention is not limited to this, and the aforementioned denominator D1 may be controlled to be set to a predetermined default value by the following steps:

(a) changing the size ratio of the current mirror circuit with the reference current $I_{REF}$; or (b) changing the capacitance C of the capacitor C by selective switchover among a plurality of capacitors.

Figure 6:
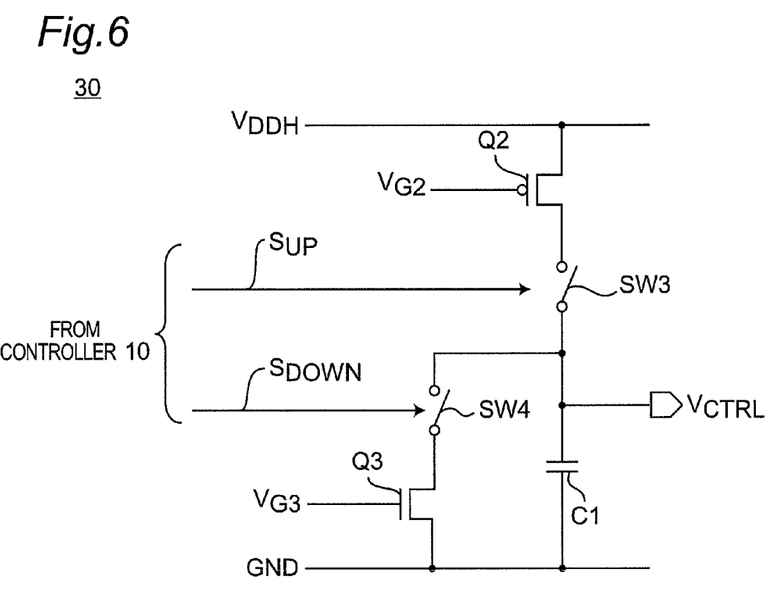
FIG. 6 is a circuit diagram showing a configuration of the feedback control voltage generator circuit 30 of FIG. 5.

FIG. 6 is a circuit diagram showing a configuration of the feedback control voltage generator circuit 30 of FIG. 5. In the feedback control signal generator circuit 30 of FIG. 6, the terminal of a power voltage $V_{DDH}$ is grounded via the source and drain of a MOS transistor Q2, a switch SW3 and the capacitor C1, while a connection point of the switch SW3 and the capacitor C1 is grounded via a switch SW4, and the source and drain of a MOS transistor Q3. Predetermined bias voltages $V_{G2}$ and $V_{G3}$ are applied to the gates of the MOS transistors Q2 and Q3, respectively. The pulses of the up-signal $S_{UP}$ from the controller 10 are applied to the switch SW3, and then the charge of the capacitor C1 increases to increase the feedback control voltage $V_{CTRL}$ by a predetermined value. Moreover, the pulses of the down-signal $S_{DOWN}$ from the controller 10 are applied to the switch SW4, and then the charge of the capacitor C1 decreases to decrease the feedback control voltage $V_{CTRL}$ by a predetermined value. Therefore, the controller 10 can perform control by increasing or decreasing the feedback control voltage $V_{CTRL}$ by using the up-signal $S_{UP}$ and the down-signal $S_{DOWN}$ of two control signals.

Figure 7A:
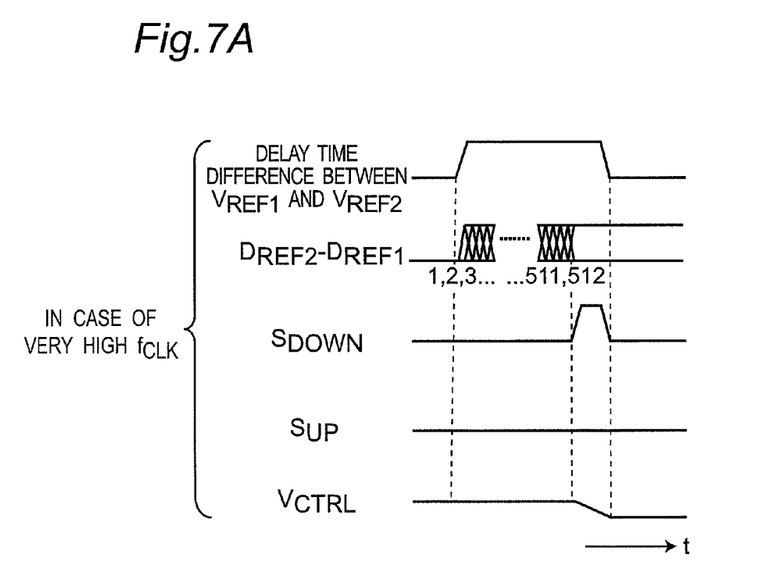
FIG. 7A is a timing chart showing an operation of the SSADC of FIG. 5 when the clock frequency $f_{CLK}$ is very high.

FIG. 7A is a timing chart showing an operation of the SSADC of FIG. 5 when the clock frequency $f_{CLK}$ is very high in a case where the aforementioned denominator D1 is greater than a predetermined default value, i.e., when the frequency $f_{CLK}$ is excessively high. In this case, the denominator D1 reaches the default value before the end of the interval of the delay time difference between the reference voltages $V_{REF1}$ and $V_{REF2}$. Accordingly, the down-signal $S_{DOWN}$ is generated from reaching the default value to the end of the interval the delay time difference. The feedback control signal generator circuit 30 of FIG. 6 lowers the feedback control voltage $V_{CTRL}$, and lowers the clock frequency $f_{CLK}$ by using the down-signal $S_{DOWN}$.

Figure 7B:
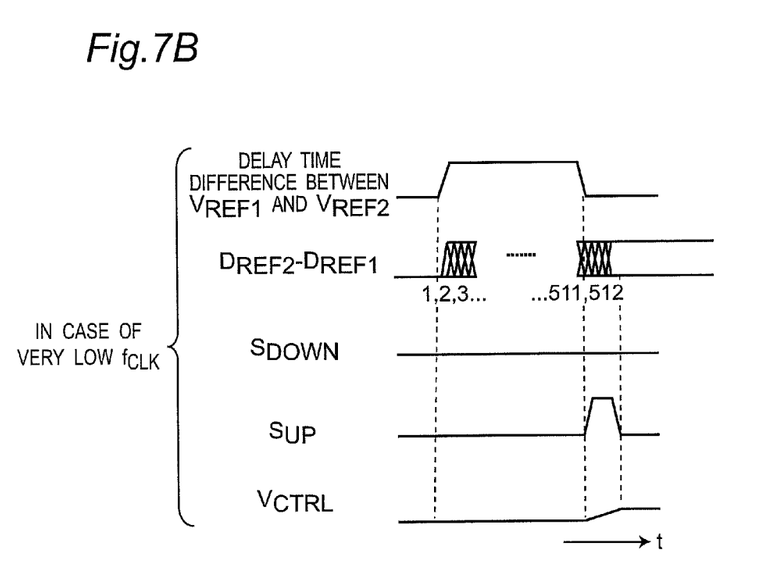
FIG. 7B is a timing chart showing an operation of the SSADC of FIG. 5 when the clock frequency $f_{CLK}$ is very low.

FIG. 7B is a timing chart showing an operation of the SSADC of FIG. 5 when the clock frequency $f_{CLK}$ is very low in a case where the aforementioned denominator D1 is smaller than the default value, i.e., when the frequency $f_{CLK}$ is excessively low. In this case, the up-signal $S_{UP}$ is generated from the end of the interval the delay time difference between the reference voltages $V_{REF1}$ and $V_{REF2}$ to reaching the default value. The control circuit heightens the control voltage $V_{CTRL}$ and heightens the clock frequency $f_{CLK}$ by using the up-signal $S_{UP}$.

The feedback control voltage $V_{CTRL}$ can be controlled so that the aforementioned denominator D1 comes to have a constant default value by the feedback loop circuit of FIG. 3 constructed as above.

Figure 8:
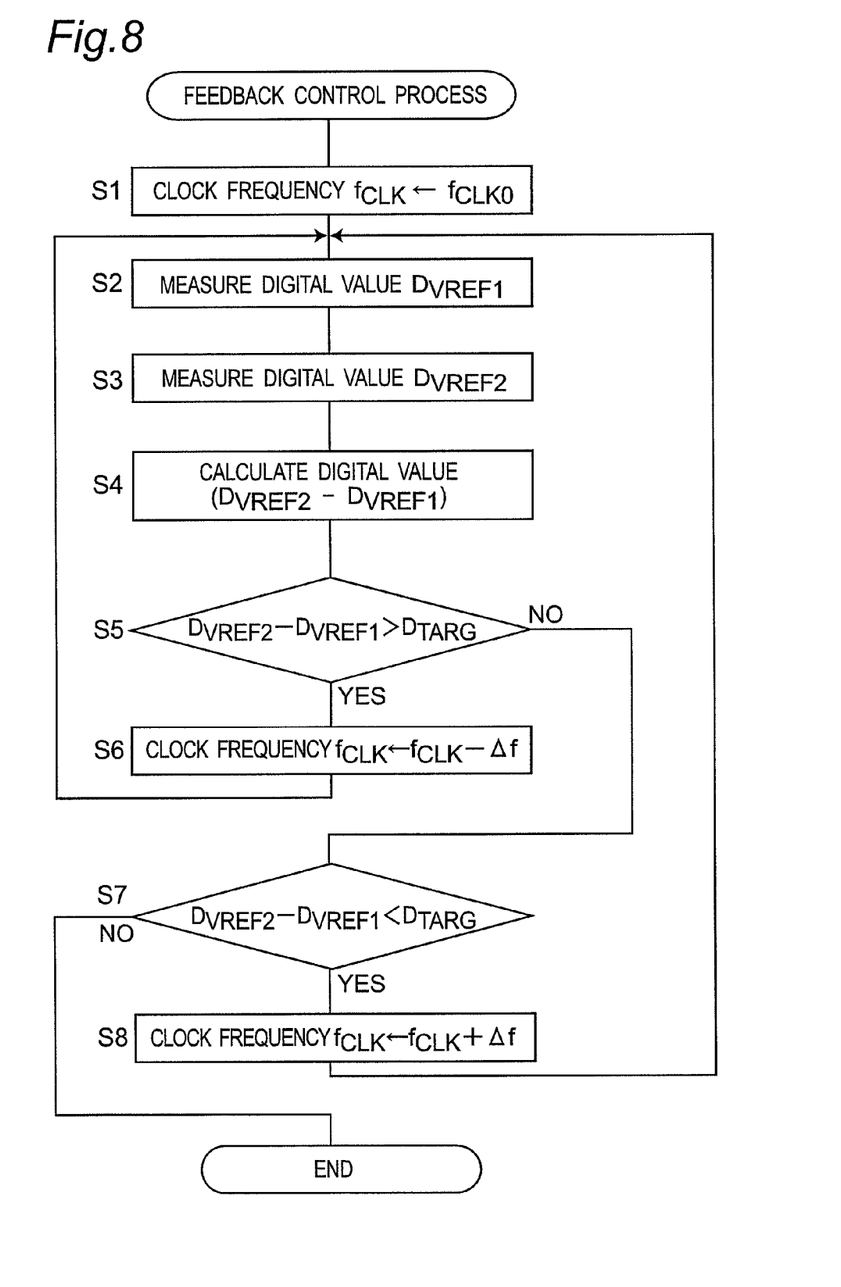
FIG. 8 is a flow chart showing a feedback control process of the SSADC of FIG. 5.

FIG. 8 is a flow chart showing a feedback control process of the SSADC of FIG. 5 executed by the controller 10.

Referring to FIG. 8, first of all, the control voltage $V_{CTRL}$ is set in step S1 by the feedback control signal generator circuit 30 so that the clock frequency $f_{CLK}$ becomes a predetermined default frequency $f_{CLK0}$, and the voltage is outputted to the voltage controlled oscillator 7. Next, in step S2, the voltage switcher 6 is switched over to the input terminal "b", and the data switcher 21 is switched over to the output terminal "b". By comparing the first reference voltage $V_{REF1}$ with the ramp voltage $V_{RMP}$, outputting the data of the count value of the counter 4 as the digital value $D_{VREF1}$ to the register 23 via the data switcher 21 when the ramp voltage $V_{RMP}$ is smaller than the first reference voltage $V_{REF1}$ (when the voltage $V_{CMP}$ of the comparator 3 falls to a low level) and by storing the value into the register, the digital value $D_{VREF1}$ is measured. Further, in step S3, the voltage switcher 6 is switched over to the input terminal "c", and the data switcher 21 is switched over to the output terminal "c". By comparing the second reference voltage $V_{REF2}$ with the ramp voltage $V_{RMP}$, outputting the data of the count value of counter 4 as the digital value $D_{VREF2}$ to the register 24 via the data switcher 21 when the ramp voltage $V_{RMP}$>second reference voltage $V_{REF2}$ (when the voltage $V_{CMP}$ of the comparator 3 falls to the low level) and storing the data into the register, the digital value $D_{VREF2}$ is measured. Then, the digital value $(D_{VREF2}-D_{VREF1})$ is calculated by the subtractor 26 in step S4.

In step S5, the digital value $(D_{VREF2}-D_{VREF1})$ is compared with a predetermined target default value $D_{TARG}$. When $D_{VREF2}-D_{VREF1}>D_{TARG}$, the controller 10 controls the feedback control voltage $V_{CTRL}$ from the feedback control signal generator circuit 30 by outputting the down-signal $S_{DOWN}$ to the feedback control signal generator circuit 30 in step S6 to lower the clock frequency $f_{CLK}$ by a predetermined value $\Delta f$, and thereafter, the program flow returns to step S2. When the answer is NO in step S5, the program flow proceeds to step S7.

When $D_{VREF2}-D_{VREF1}<D_{TARG}$ in step S7, the controller 10 controls the feedback control voltage $V_{CTRL}$ from the feedback control signal generator circuit 30 by outputting the up-signal $S_{UP}$ to the feedback control signal generator circuit 30 in step S8 to heighten the clock frequency $f_{CLK}$ by the predetermined value $\Delta f$, and thereafter, the program flow returns to step S2. When the answer is NO in step S7, it is judged that the clock frequency $f_{CLK}$ has reached the clock frequency corresponding to the desired target default value, and the feedback control process ends.

The controller 10 executes measurement of the digital value $D_{VIN}$ and measurement of the digital value $D_{VREF1}$ after the feedback control process, and this leads to obtaining data D2 outputted from the subtractor 25. The data D2 is the linear function value of the AD converted value, and a proportional value (AD converted value) of the input voltage $V_{IN}$ can be obtained by subtracting the numerator (($V_{REF1}$) of the second term of the Equation (4)) of a predetermined constant value that does not depend on the digital value $D_{vIN}$ from the data D2 in a manner similar to that of the first preferred embodiment. The obtained division result and the AD converted value are displayed on the LCD part 11.

Although the subtractor circuit 20A is configured to include a hardware circuit in the preferred embodiment described above, the present invention is not limited to this, and the subtractor circuit 20A may be constructed to be operated by the controller 10. Moreover, in the SSADC of FIG. 5, an up-down counter may be constructed to be used in place of the subtractors 25 and 26. In this case, the digital value before the division can be obtained by performing countdown so as to subtract the digital value $D_{VREF1}$ corresponding to the reference voltage $V_{REF1}$ from the digital value $D_{VIN}$ of the input voltage $V_{IN}$ and performing countdown so as to subtract the digital value $D_{VREF2}$ corresponding to the reference voltage $V_{REF2}$ from the digital value $D_{VIN}$ of the input voltage $V_{IN}$.

Modified Preferred Embodiments

Although the capacitor C is charged by flowing the reference current $I_{REF}$ of the capacitor C and the ramp voltage $V_{RMP}$ is provided by the induced voltage of the charging in each of the aforementioned preferred embodiments, the present invention is not limited to this, and it is acceptable to generate a ramp voltage $V_{RMP}$ that decreases with a predetermined slope as the time elapses by charging the capacitor C and thereafter performing discharging so as to flow a predetermined current. That is, the ramp voltage $V_{RMP}$ is required to be a voltage that varies with a predetermined slope as the time elapses. In the aforementioned case of discharging, the comparator 3 outputs a high-level output voltage $V_{CMP}$ in an interval from when the ramp voltage $V_{RMP}$ has become smaller than each of the voltages $V_{IN}$, $V_{REF1}$ and $V_{REF2}$ to when the ramp voltage $V_{RMP}$ becomes 0 V, and the counter 4 counts the clock during the interval.

Although the division result Q that corresponds to the input voltage $V_{IN}$ and is a linear function of the input voltage $V_{IN}$ is obtained by using the Equation (3) in each of the aforementioned preferred embodiments, the present invention is not limited to this, and it is acceptable to obtain a division result Q that corresponds to the input voltage $V_{IN}$ according to the following equation and is the linear function of the input voltage $V_{IN}$. It is proper to perform control so that the denominators of the following equations become default values in the case of the second preferred embodiment:

$$Q = \frac{D_{VIN} - D_{VREF2}}{D_{VREF2} - D_{VREF1}}, \quad (3a)$$

$$Q = \frac{D_{VIN} - D_{VREF1}}{D_{VREF1} - D_{VREF2}}, \text{ and} \quad (3b)$$

$$Q = \frac{D_{VIN} - D_{VREF2}}{D_{VREF1} - D_{VREF2}}. \quad (3c)$$

IMPLEMENTAL EXAMPLES

The present inventor and others evaluated the SSADC of FIG. 3 through simulations by a 0.18-μm CMOS process. By setting the power voltage $V_{DDH}$ to 1.8 V, setting the capacitance of the capacitor C to 8.56 pF, and setting the reference voltages $V_{REF1}$ and $V_{REF2}$ to 0.6 V and 1.2 V, respectively, a voltage was applied from an external circuit or device. It is noted that the evaluation was made by using delay time instead of measurement by the counter 4.

Figure 9:
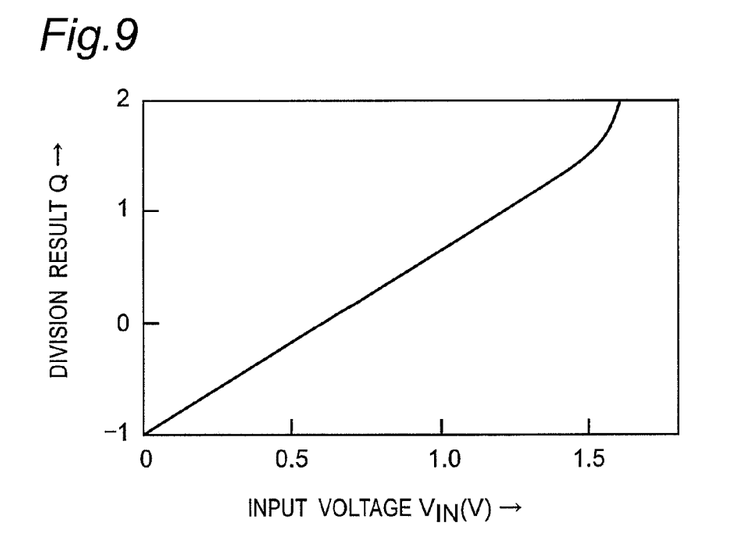
FIG. 9 is a graph showing a division result Q with respect to an input voltage $V_{IN}$ according to simulation results of the SSADC of FIG. 3.

FIG. 9 is a graph showing a division result Q with respect to the input voltage $V_{IN}$ according to the simulation results of the SSADC of FIG. 3. As apparent from FIG. 9, it could be confirmed that the division result Q linearly varied with respect to the input voltage $V_{IN}$ when the input voltage $V_{IN}$=1.4 V or less.

Figure 10:
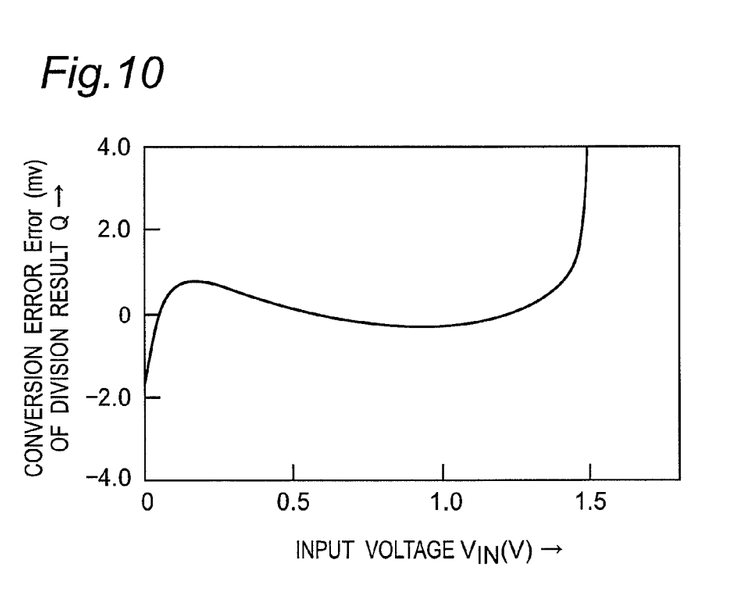
FIG. 10 is a graph showing a conversion error of the division result Q with respect to the input voltage $V_{IN}$ according to a simulation result of the SSADC of FIG. 3.

FIG. 10 is a graph showing a conversion error of the division result Q with respect to the input voltage $V_{IN}$ according to the simulation result of the SSADC of FIG. 3. As apparent from FIG. 10, the operation can be achieved with a conversion error of ±4 mV or less within a range of 0.1 V to 1.4 V. In other ranges, the conversion error Error is generated due to the common-mode dependence of the comparator, the voltage dependence of the capacitor C, and the drain-source voltage dependence of the MOS transistor Q1 that configures the current mirror circuit.

Figure 11:
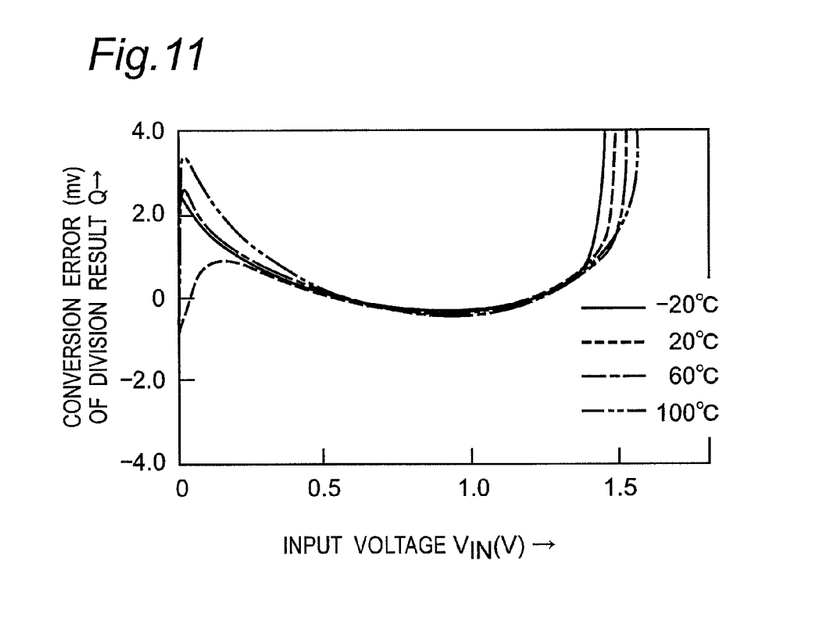
FIG. 11 is a graph showing a conversion error of the division result Q with respect to the input voltage $V_{IN}$ when the temperature is varied according to simulation results of the SSADC of FIG. 3.

FIG. 11 is a graph showing a conversion error of the division result Q with respect to the input voltage $V_{IN}$ when the temperature is varied to −20° C., 20° C., 60° C. and 100° C. according to the simulation results of the SSADC of FIG. 3. As apparent from FIG. 11, it could be confirmed that the non-ideal factors were removed by performing subtraction and division, and the error hardly varied with respect to the temperature variations.

Figure 12:
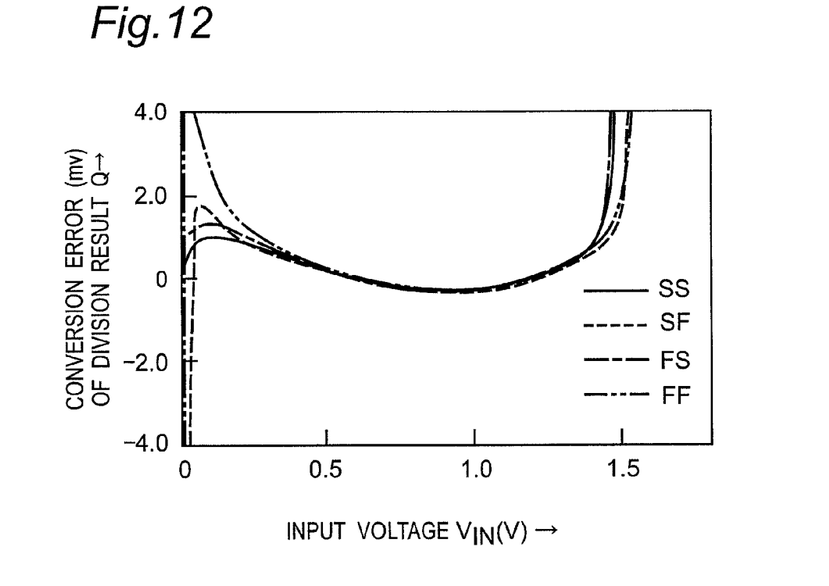
FIG. 12 is a graph showing a conversion error of the division result Q with respect to the input voltage $V_{IN}$ when the process corner is varied according to simulation results of the SSADC of FIG. 3.

FIG. 12 is a graph showing a conversion error of the division result Q with respect to the input voltage $V_{IN}$ when the process corner is varied according to the simulation results of the SSADC of FIG. 3. The simulation of FIG. 12 is the simulation performed by varying the process corner of the MOS transistor, or the simulation that is called the corner analysis or the worst-case analysis. The n-channel MOS transistor and the p-channel MOS transistor vary from the parameters (typical values) originally estimated in the manufacturing stages, and this is called the manufacturing variations. In the case, such a state that the MOS transistor has the greatest current is called "high-speed (Fast)", and this presumably includes states in which the threshold voltage $V_{TH}$ that determines the current characteristics of the MOS transistor low, the gate length L is short, the gate width W is long, the oxide thickness is thin, the mobility is large, and so on. Conversely, such a state that the transistor has the smallest current is called "low-speed (Slow)", and this presumably includes states in which the aforementioned parameters vary in the opposite directions. Each of the n-channel MOS transistor and the p-channel MOS transistor has the two types of states as described above, and there are the following four kinds of states in all:

(1) SS: When the n-channel MOS transistor is Slow, and the p-channel MOS transistor is Slow;

(2) SF: When the n-channel MOS transistor is Slow, and the p-channel MOS transistor is Fast;

(3) FS: When the n-channel MOS transistor is Fast, and the p-channel MOS transistor is Slow; and (4) FF: When the n-channel MOS transistor is Fast, and the p-channel MOS transistor is Fast.

As apparent from FIG. 12, it could be confirmed that the non-ideal factors were removed by performing subtraction and division, and the error hardly varied with respect to the process variations.

As described above, according to each of the aforementioned preferred embodiments, the SSADC capable of correcting the characteristic deterioration due to the delay time of the comparator 3 and the PVT variations has been proposed. In the SSADC of the present preferred embodiment, the input voltage $V_{IN}$ and the two reference voltages $V_{REF1}$ and $V_{REF2}$ are compared with the ramp voltage $V_{RMP}$ generated by the capacitor C and the reference current $I_{REF}$ by using the comparator 3. Then, the time until the inversion of the comparator 3 is measured by the counter 4. By performing subtraction and division with respect to the time corresponding to each of the voltages $V_{IN}$, $V_{REF1}$ and $V_{REF2}$ (in the first preferred embodiment) or forming the feedback loop circuit instead of division (in the second preferred embodiment), the influences of the delay time of the comparator 3 and the PVT variations can be removed. The SSADC of the present preferred embodiment can perform AD conversion with the accuracy of an error of ±45 mV or less.

As described in detail above, according to the AD converter circuit of the present invention, an accurate digital value can be outputted by correcting the characteristic deterioration due to the delay time of the comparator and other non-ideal factors.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A single slope AD converter circuit, comprising:
a comparator configured to compare a ramp voltage varying with a predetermined slope as time elapses with an analog input voltage;
a counter configured to count a predetermined clock in parallel with the comparing process of the comparator, and
a controller configured to output a clock count value corresponding to elapsed time when the ramp voltage is smaller than the analog input voltage, as an AD converted first digital value, wherein
(A) the comparator compares the ramp voltage with a predetermined first reference voltage, the counter counts the clock in parallel with the comparing process, and the controller outputs the clock count value corresponding to the elapsed time as an AD converted second digital value,
(B) the comparator compares the ramp voltage with a predetermined second reference voltage different from the first reference voltage, the counter counts the clock in parallel with the comparing process, and the controller outputs the clock count value corresponding to the elapsed time as an AD converted third digital value, and
(C) the controller divides one of a difference between the first and second digital values, and a difference between the first and third digital values, by a difference between the second and third digital values, and outputs a value of a division result as a value corresponding to an AD converted value.

2. The AD converter circuit as claimed in claim 1,
wherein, when the first digital value is $D_{VDIN}$, the second digital value is $D_{VREF1}$, and the third digital value is $D_{VREF2}$, then the controller calculates a division result Q by using the following equation:

$$Q = \frac{D_{VIN} - D_{VREF1}}{D_{VREF2} - D_{VREF1}}.$$

3. The AD converter circuit as claimed in claim 1,
wherein, when the first digital value is $D_{VDIN}$, the second digital value is $D_{VREF1}$, and the third digital value is $D_{VREF2}$, then the controller calculates a division result Q by using the following equation:

$$Q = \frac{D_{VIN} - D_{VREF2}}{D_{VREF2} - D_{VREF1}}.$$

4. The AD converter circuit as claimed in claim 1,
wherein, when the first digital value is $D_{VDIN}$, the second digital value is $D_{VREF1}$, and the third digital value is $D_{VREF2}$, then the controller calculates a division result Q by using the following equation:

$$Q = \frac{D_{VIN} - D_{VREF1}}{D_{VREF1} - D_{VREF2}}.$$

5. The AD converter circuit as claimed in claim 1,
wherein, when the first digital value is $D_{VDIN}$, the second digital value is $D_{VREF1}$, and the third digital value is $D_{VREF2}$, then the controller calculates a division result Q by using the following equation:

$$Q = \frac{D_{VIN} - D_{VREF2}}{D_{VREF1} - D_{VREF2}}.$$

6. The AD converter circuit as claimed in claim 1, further comprising:
a ramp voltage generator configured to generate the ramp voltage by electrically charging and/or discharging the capacitor with a predetermined reference current.

7. The AD converter circuit as claimed in claim 1,
wherein the controller calculates an AD converted value proportional to the analog input voltage by adding and/or subtracting a predetermined constant value that does not depend on the first digital value to and/or from the value of the division result, and outputs the calculated AD converted value.

8. The AD converter circuit as claimed in claim 1,
wherein the controller performs feedback control of the AD converter circuit so that a difference between the second and third digital values becomes a predetermined default value, thereafter calculates one of a difference between the first and second digital values, and a difference between the first and third digital values, and outputs a calculated difference as a value corresponding to the AD converted value.

9. The AD converter circuit as claimed in claim 6,
wherein the controller performs feedback control of the AD converter circuit so that a difference between the second and third digital values becomes a predetermined default value, thereafter calculates one of a difference between the first and second digital values, and a difference between the first and third digital values, and outputs a calculated difference as a value corresponding to the AD converted value.

10. The AD converter circuit as claimed in claim 8, wherein the controller performs feedback control of the AD converter circuit so that the difference between the second and third digital values becomes a predetermined default value by varying a clock frequency inputted to the counter.

11. The AD converter circuit as claimed in claim 10, further comprising:
    a voltage controlled oscillator configured to generate the clock so that the clock frequency varies on the basis of a predetermined control voltage; and
    a voltage generator circuit including a first circuit configured to increase a voltage of a further capacitor on the basis of an up-signal, and a second circuit configured to decrease the voltage of the further capacitor on the basis of a down-signal, the voltage generator circuit outputting a voltage of the further capacitor as the control voltage,
    wherein the controller increases the clock frequency with the voltage of the further capacitor increased by outputting the up-signal to the voltage generator circuit when increasing the clock frequency in performing control so that the difference between the second and third digital values becomes a predetermined default value, and/or decreases the clock frequency with the voltage of the further capacitor decreased by outputting the down-signal to the voltage generator circuit when decreasing the clock frequency in performing control so that the difference between the second and third digital values becomes a predetermined default value.

12. The AD converter circuit as claimed in claim 9, wherein the controller performs feedback control of the AD converter circuit so that the difference between the second and third digital values becomes a predetermined default value by varying the capacitance of the capacitor.

13. The AD converter circuit as claimed in claim 8, wherein the controller calculates an AD converted value proportional to the analog input voltage by adding and/or subtracting a predetermined constant value that does not depend on the first digital value to and/or from a calculated difference, which is one of a difference between the first and second digital values, and a difference between the first and third digital values, and outputs the calculated AD converted value.

\* \* \* \* \*